(12) United States Patent
Tu et al.

(10) Patent No.: US 8,394,653 B2
(45) Date of Patent: Mar. 12, 2013

(54) METHOD FOR FABRICATING SEMICONDUCTOR LIGHTING CHIP

(75) Inventors: Po-Min Tu, Hsinchu (TW); Shih-Cheng Huang, Hsinchu (TW); Ya-Wen Lin, Hsinchu (TW); Chia-Hung Huang, Hsinchu (TW); Shun-Kuei Yang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 64 days.

(21) Appl. No.: 13/216,248

(22) Filed: Aug. 24, 2011

(65) Prior Publication Data
US 2012/0164764 A1    Jun. 28, 2012

(30) Foreign Application Priority Data
Dec. 28, 2010   (CN) .............................. 201010606545

(51) Int. Cl.
*H01L 21/00* (2006.01)
(52) U.S. Cl. ...... 438/22; 438/41; 438/751; 257/E21.034
(58) Field of Classification Search .................... 438/22, 438/41, 751; 257/E21.034
See application file for complete search history.

(56) References Cited

U.S. PATENT DOCUMENTS

| | | | |
|---|---|---|---|
| 2009/0162959 A1* | 6/2009 | Hsu et al. | 438/33 |
| 2009/0291518 A1* | 11/2009 | Kim et al. | 438/33 |
| 2012/0171791 A1* | 7/2012 | Tu et al. | 438/33 |

\* cited by examiner

*Primary Examiner* — William D Coleman
*Assistant Examiner* — Christine Enad
(74) *Attorney, Agent, or Firm* — Altis Law Group, Inc.

(57) ABSTRACT

A method for fabricating a semiconductor lighting chip includes steps of: providing a substrate with a first block layer dividing an upper surface of the substrate into a plurality of epitaxial regions; forming a first semiconductor layer on the epitaxial regions; forming a second block layer partly covering the first semiconductor layer; forming a lighting structure on an uncovered portion of the first semiconductor layer; removing the first and the second block layers thereby defining clearances at the bottom surfaces of the first semiconductor layer and the lighting structure; and permeating etching solution into the first and second clearances to etch the first semiconductor layer and the lighting structure, thereby to form each of the first semiconductor layer and the lighting structure with an inverted frustum-shaped structure.

16 Claims, 8 Drawing Sheets

METHOD FOR FABRICATING SEMICONDUCTOR LIGHTING CHIP

TECHNICAL FIELD

The disclosure generally relates to a method for fabricating a semiconductor lighting chip.

DESCRIPTION OF RELATED ART

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

The LED generally includes a lighting chip, which includes an n-type semiconductor layer, an active layer and a p-type semiconductor layer sequentially formed on a substrate. When a voltage is applied between the n-type semiconductor layer and the p-type semiconductor layer, hole-electron recombination will happen at the active layer, and energy is released in the form of light.

In order to improve luminescent efficiency of the lighting chip, the lighting chip is etched to form an inverted frustum-shaped structure, in which a width of the lighting chip gradually decreases from an upper surface to a bottom surface thereof. Therefore, more light will travel to the external environment through inclined sidewalls of the lighting chip. However, the lighting chip is generally etched at a temperature higher than 170° C.; such a high temperature may affect lighting properties of the lighting chip.

Therefore, a method for fabricating a semiconductor lighting chip is desired to overcome the above described shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

An embodiment of a method for fabricating a semiconductor lighting chip will now be described in detail below and with reference to the drawings.

Figure 1:
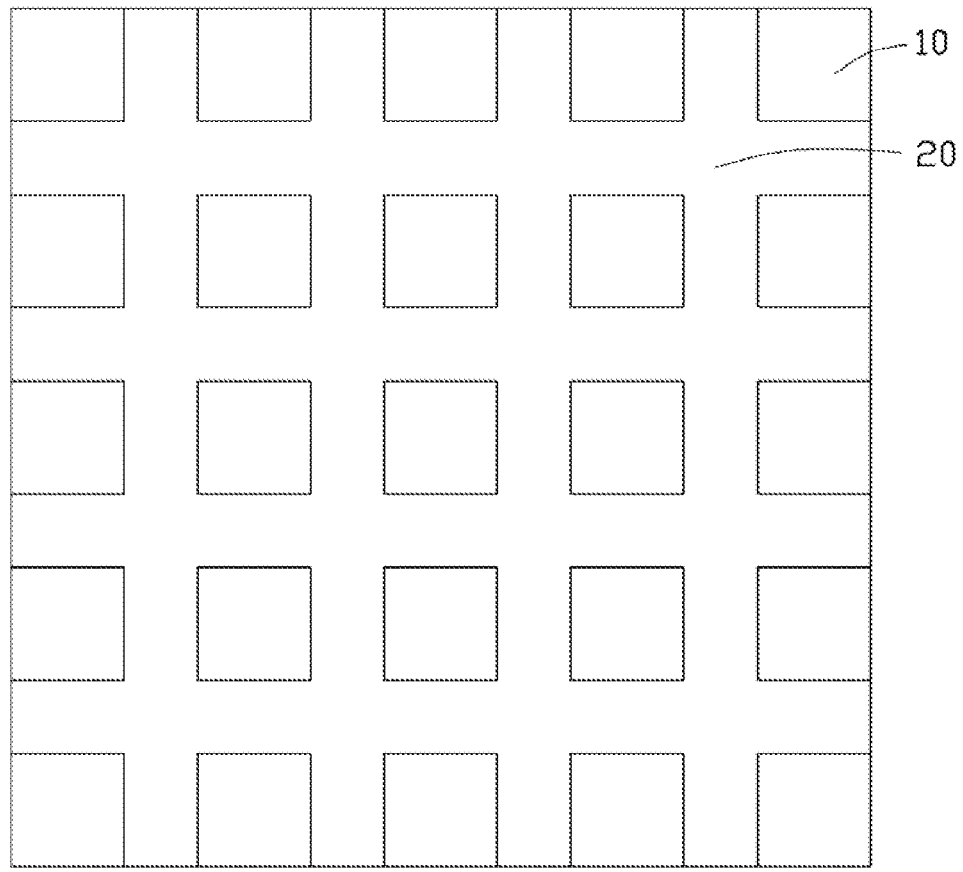
FIG. 1 is a top view of a substrate and a first block layer in a first step of a method for fabricating a semiconductor lighting chip according to an embodiment of the present disclosure.
Figure 2:
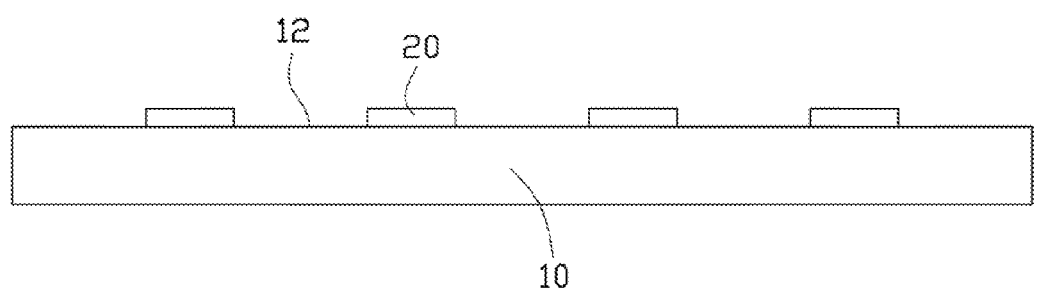
FIG. 2 is a side view of the substrate and the first block layer in FIG. 1.

Referring to FIGS. 1-2, a substrate 10 is firstly provided. Material of the substrate 10 can be selected from a group consisting of Si, SiC, GaN and sapphire. In this embodiment, the substrate 10 is made of sapphire. And then, a first block layer 20 is formed on an upper surface of the substrate 10 by vacuum evaporation or sputtering. The first block layer 20 is in the form of a two-dimensional grid. The first block layer 20 is made of $SiO_2$ or $Si_3N_4$ to prevent semiconductor layers from growing thereon. In this embodiment, the first block layer 20 is made of $SiO_2$ and divides the upper surface of the substrate 10 into a number of epitaxial regions 12 for growth of semiconductor layers. The epitaxial regions 12 each are rectangular. A width of the rectangular epitaxial region 12 is about 300 μm and a distance between two neighboring epitaxial regions 12 is about 20 μm. In other words, a width of each line of the grid formed by the first block layer 20 is about 20 μm.

Figure 3:
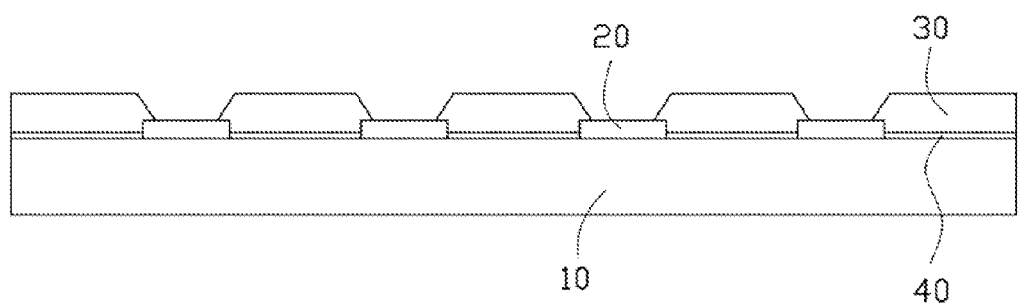
FIG. 3 is a schematic view showing a semiconductor structure formed by a second step of the method for fabricating the semiconductor lighting chip.

Referring to FIG. 3, a first semiconductor layer 30 is formed on the epitaxial regions 12 by metal organic chemical vapor deposition (MOCVD), molecular beam epitaxy (MBE) or hydride vapor phase epitaxy (HYPE). The first semiconductor layer 30 can be an n-type GaN layer, an AlGaN layer, an AlInGaN layer or a GaAs layer, and a thickness thereof is about 2 μm. The first block layer 20 prevents the first semiconductor layer 30 from directly growing thereon and divides the first semiconductor layer 30 into a number of individual islands. To a certainty, the first semiconductor layer 30 growing on the epitaxial regions 12 will cover a part of the first block layer 20 due to lateral growth thereof. By controlling the growth condition, the first semiconductor layer 30 can be limited to cover only a peripheral edge of the first block layer 20, thereby exposing a central part of the first block layer 20. For reducing defects caused by the lattice mismatch between the first semiconductor layer 30 and the substrate 10, a buffer layer 40 is grown on the epitaxial regions 12 of the substrate 10 before forming the first semiconductor layer 30. The buffer layer 40 is made of GaN or AlN, and a thickness thereof is about 20 nm.

Figure 4:
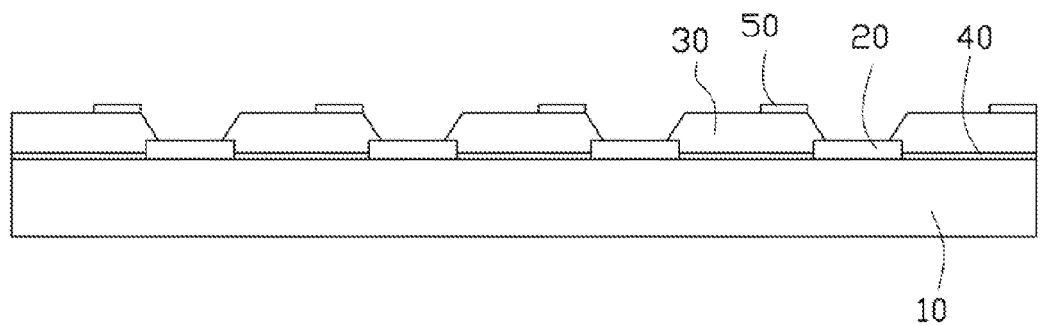
FIG. 4 is a schematic view showing the semiconductor structure formed by a third step of the method for fabricating the semiconductor lighting chip.

Referring to FIG. 4, a second block layer 50 is formed on an upper surface of the first semiconductor layer 30 by vacuum evaporation or sputtering. The material of the second block layer 50 is similar to that of the first block layer 20, such as $SiO_2$ or $Si_3N_4$. In this embodiment, the second block layer 50 is made of $SiO_2$ and is partly etched away to cover a right portion of an upper surface of each island of the first semiconductor layer 30, whereby a left portion of the upper surface of each island of the first semiconductor layer 30 is exposed. An area of the second block layer 50 on each island is smaller than a half of the upper surface of the island.

Figure 5:
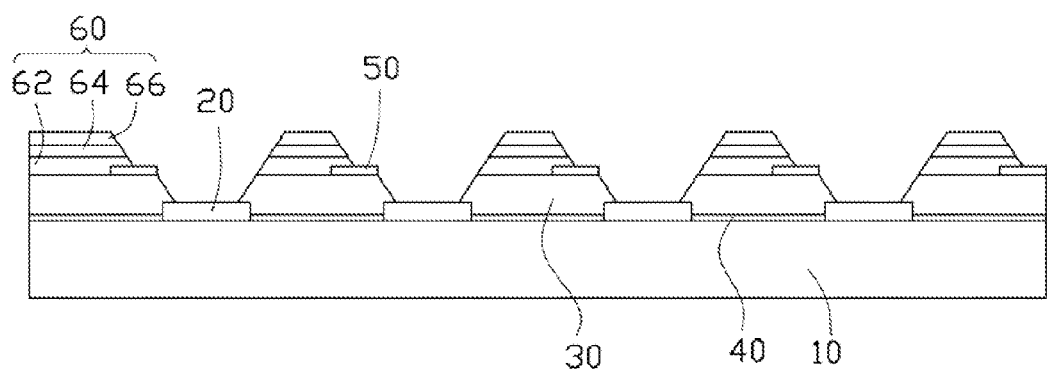
FIG. 5 is a schematic view showing the semiconductor structure formed by a fourth step of the method for fabricating the semiconductor lighting chip.

Referring to FIG. 5, a lighting structure 60 is formed on the exposed left portion of the upper surface of each island of the first semiconductor layer 30 with a width gradually decreased from the first semiconductor layer 30 toward a top of the lighting structure 60. The lighting structure 60 includes a second semiconductor layer 62, an active layer 64 and a third semiconductor layer 66 formed on the first semiconductor layer 30 in sequence by MOCVD, MBE or HYPE. The second semiconductor layer 62 not only covers the exposed left portion of the upper surface of the corresponding island, but also partly covers the second block layer 50 on the corresponding island. In this embodiment, the second semiconductor layer 62 is an n-type GaN layer, the active layer 64 is a multiple quantum well (MQW) GaN layer, and the third semiconductor layer 66 is a p-type GaN layer. A thickness of the lighting structure 60 is the same as the thickness of the first semiconductor layer 30. In this embodiment, the thickness of the lighting structure 60 is about 2 μm.

Figure 6:
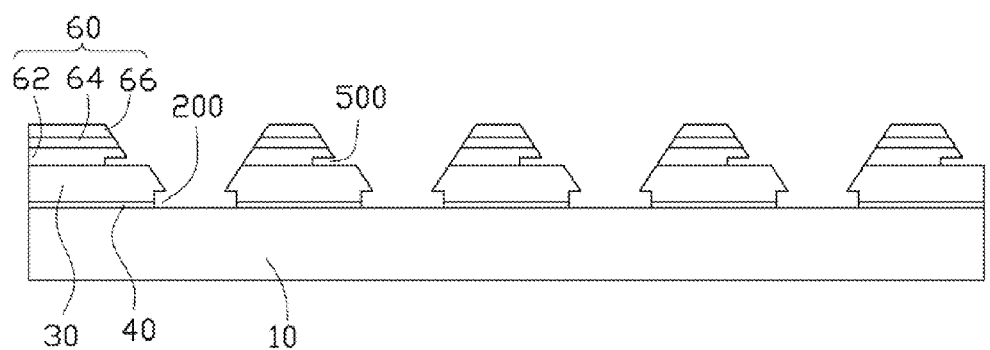
FIG. 6 is a schematic view showing the semiconductor structure formed by a fifth step of the method for fabricating the semiconductor lighting chip.

Referring to FIG. 6, the first block layer 20 and the second block layer 50 are removed by a buffered oxide etch (BOE) solution, which is a mixture of hydrofluoric acid (HF) and ammonium fluoride ($NH_4F$). The BOE solution can effectively etch away the $SiO_2$ layer without damaging other semiconductor layers. After the first block layer 20 and the second block layer 50 are removed, a number of clearances 200 are formed at the position of the first block layer 20, thereby exposing a part of a bottom of the first semiconductor layer 30, and a number of clearances 500 are formed at the position of the second block layer 50, thereby exposing a part of a bottom of the second semiconductor layer 62 of the lighting structure 60.

And then, the first semiconductor layer 30 and the lighting structure 60 on the substrate 10 each are etched by chemical etching to form an inverted frustum-shaped structure. In this embodiment, KOH is adopted for etching the first semiconductor layer 30 and the lighting structure 60. A concentration of the KOH is between 2 mol/L and 7 mol/L, an etching time is between 5 minutes and 30 minutes, and an etching temperature is lower than 100° C. In this embodiment, the first semiconductor layer 30 and the lighting structure 60 are etched at a temperature of 75° C. for 15 minutes by a 2 mol/L KOH solution, thereby to obtain an acquired shape of the semiconductor lighting chip.

Because the first block layer 20 and the second block layer 50 are removed before etching, the KOH solution can permeate into the clearances 200 and 500, thereby to etch the first semiconductor layer 30 and the lighting structure 60 from the bottom surfaces thereof simultaneously. During the etching, the etching solution removes sidewalls of the chip. Therefore, the etching can be accelerated at a temperature lower than 100° C. to achieve the desired shapes of the lighting structure 60 and the first semiconductor layer 30, without the necessity of higher etching temperature. Therefore, an inverted frustum-shaped structure of the first semiconductor layer 30 and of the lighting structure 60 is obtained in a relatively low temperature. In addition, the required etching time is reduced in accordance with the present disclosure.

Figure 7:
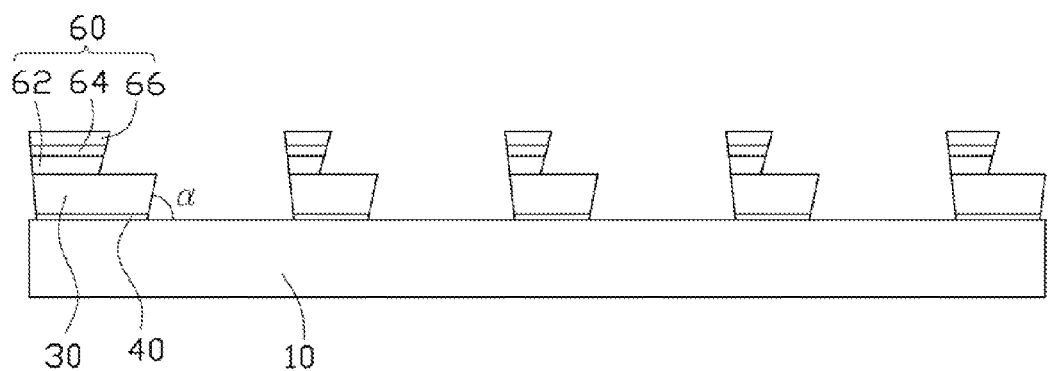
FIG. 7 is a schematic view showing the semiconductor structure formed by a sixth step of the method for fabricating the semiconductor lighting chip.
Figure 8:
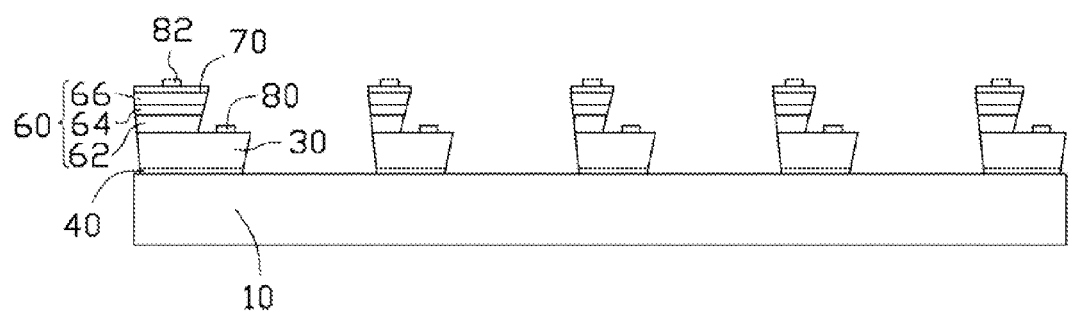
FIG. 8 is a schematic view showing the semiconductor structure formed by a seventh step of the method for fabricating the semiconductor lighting chip.

Referring to FIG. 7, after the etching process, a width of the first semiconductor layer 30 gradually decreases from an upper surface to a bottom surface thereof, and a width of the lighting structure 60 gradually decreases from an upper surface to a bottom surface thereof. Because planes (10-1-1) and (11-2-2) of GaN structure are hard to be etched by the KOH solution, the two planes (10-1-1) and (11-2-2) will be left after the etching process. Therefore, an included angle α between sidewalls of the first semiconductor layer 30 and the bottom surface thereof is in a range from 57 degrees to 62 degrees. Similarly, an included angle between sidewalls of the lighting structure 60 and the bottom surface thereof is in a range from 57 degrees to 62 degrees.

Finally, a transparent conductive layer 70 is formed on an upper surface of the third semiconductor layer 66 by vacuum evaporation, sputtering, chemical deposition, or E-gun evaporation. A second electrode 82 is formed on an upper surface of the transparent conductive layer 70 by E-gun evaporation, vacuum evaporation or sputtering. A first electrode 80 is formed on the first semiconductor layer 30 by E-gun evaporation, vacuum evaporation or sputtering. The transparent conductive layer 70 can be made of ITO or Ni/Au alloy; therefore current will spread in the third semiconductor layer 66 uniformly. In this embodiment, the first electrode 80 and the second electrode 82 are made of metal to connect the semiconductor lighting chip with an external power source. Finally, the substrate 10 can be cut to form a plurality of semiconductor lighting chips.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for fabricating a semiconductor lighting chip, comprising steps:
   providing a substrate with a first block layer formed thereon, the first block layer dividing an upper surface of the substrate into a plurality of epitaxial regions;
   forming a first semiconductor layer on the epitaxial regions, the first semiconductor layer overlapping a part of the first block layer;
   forming a second block layer partly covering an upper surface of the first semiconductor layer;
   forming a lighting structure on an uncovered portion of the upper surface of the first semiconductor layer, the lighting structure overlapping a part of the second block layer;
   removing the first block layer to form a first clearance and removing the second block layer to form a second clearance; and
   permeating etching solution into the first and second clearances to etch the first semiconductor layer and the lighting structure, thereby forming the first semiconductor layer with an inverted frustum-shaped structure having a width thereof gradually decreasing from the upper surface to a bottom surface of the first semiconductor layer, and forming the lighting structure with an inverted frustum-shaped structure having a width thereof gradually decreasing from an upper surface to a bottom surface of the lighting structure.

2. The method for fabricating a semiconductor lighting chip of claim 1, wherein the first block layer and the second block layer are made of $SiO_2$.

3. The method for fabricating a semiconductor lighting chip of claim 2, wherein the first block layer and the second block layer are removed by a buffered oxide etching solution.

4. The method for fabricating a semiconductor lighting chip of claim 1, wherein a part of the first semiconductor layer formed on one of the epitaxial regions is isolated from another part of the first semiconductor layer formed on a neighboring one of the epitaxial regions by the first block layer.

5. The method for fabricating a semiconductor lighting chip of claim 1, wherein forming the lighting structure comprises forming a second semiconductor layer, an active layer and a third semiconductor layer sequentially on the first semiconductor layer.

6. The method for fabricating a semiconductor lighting chip of claim 5, wherein a dopant of the first semiconductor layer is the same as that of the second semiconductor layer.

7. The method for fabricating a semiconductor lighting chip of claim 6, wherein the first semiconductor layer and the second semiconductor layer are n-doped, and the third semiconductor layer is p-doped.

8. The method for fabricating a semiconductor lighting chip of claim 1, further comprising forming a buffer layer on the substrate before forming the first semiconductor layer.

9. The method for fabricating a semiconductor lighting chip of claim 1, wherein the first semiconductor layer and the lighting structure are etched by KOH solution.

10. The method for fabricating a semiconductor lighting chip of claim 9, wherein the first semiconductor layer and the lighting structure are etched by the KOH solution at a temperature lower than 100° C.

11. The method for fabricating a semiconductor lighting chip of claim 9, wherein the first semiconductor layer and the lighting structure are etched by the KOH solution for 2 to 30 minutes.

12. The method for fabricating a semiconductor lighting chip of claim 11, wherein the concentration of the KOH solution is 2 mol/L, and the first semiconductor layer and the lighting structure are etched by the KOH solution at a temperature of 75° C. for 15 minutes.

13. The method for fabricating a semiconductor lighting chip of claim 1, wherein after the etching of the first semiconductor layer and the lighting structure, an included angle between a sidewall and the bottom surface of the first semiconductor layer is in a range from 57 degrees to 62 degrees.

14. The method for fabricating a semiconductor lighting chip of claim 13, wherein an included angle between a sidewall and the bottom surface of the lighting structure is in a range from 57 degrees to 62 degrees.

15. The method for fabricating a semiconductor lighting chip of claim 1, further comprising forming a transparent conductor layer on the upper surface of the lighting structure after etching of the first semiconductor layer and the lighting structure.

16. The method for fabricating a semiconductor lighting chip of claim 15, further comprising forming a first electrode on the upper surface of the first semiconductor layer, and forming a second electrode on an upper surface of the transparent conductive layer.

\* \* \* \* \*